United States Patent [19]

Soda

[11] Patent Number: 5,682,119
[45] Date of Patent: Oct. 28, 1997

[54] VARIABLE GAIN CIRCUIT

[75] Inventor: Masaaki Soda, Tokyo, Japan

[73] Assignee: NEC Corporation, Tokyo, Japan

[21] Appl. No.: 606,311

[22] Filed: Feb. 23, 1996

[30] Foreign Application Priority Data

Mar. 1, 1995 [JP] Japan .................... 7-041537

[51] Int. Cl.$^6$ .................................................. H03P 3/45
[52] U.S. Cl. ................................. 330/252; 330/254
[58] Field of Search ........................... 330/252, 253, 330/254, 257, 261

[56] References Cited

U.S. PATENT DOCUMENTS 4,227,256  10/1980  O'Keefe ........................ 330/254 X
4,727,335  2/1988  Yokoyama ...................... 330/254

FOREIGN PATENT DOCUMENTS 4-319805  11/1992  Japan .

OTHER PUBLICATIONS

T. Tsukahara et al., "A 2V 2GHz Si–Bipolar Direct–Conversion Quadrature Modulator", IEEE International Solid State Circuits Conference, Feb. 1994, pp. 40–41.

*Primary Examiner*—Steven Mottola
*Attorney, Agent, or Firm*—Young & Thompson

[57] ABSTRACT

A pair of input signals are connected to a first and second differential amplifier. The positive outputs of the differential amplifiers are connected to a first load and a first output terminal while the negative outputs are connected to a second load and a second output terminal. A constant current source is connected to each differential amplifier, and a control signal is connected to an input of a third differential amplifier and a third constant current source is connected to the third differential amplifier. Voltage to current conversion circuits convert voltage outputs of the third differential amplifier into current and input the resulted current to a reference current input terminal of the first and second constant current sources. Differential output signals are obtained from the first and second output terminals.

2 Claims, 4 Drawing Sheets

VARIABLE GAIN CIRCUIT

BACKGROUND OF THE INVENTION

1. Field of the Invention

This invention relates to a wideband variable gain circuit.

2. Description of the Related Art

A variable gain circuit is connected next to a pre-amplifier in an optical receiver or a like circuit and is used widely in order to control the amplitude of the output signal thereof to a fixed level irrespective of the amplitude of the input signal thereto by varying the gain thereof. Although the variable gain circuit can be formed in various circuit forms, particularly where circuit components are DC connected to construct an integrated circuit, it is important for the variable gain circuit to have a circuit form in which the DC bias of the output terminal of the circuit does not change by a variation of the gain of the circuit in order that a circuit succeeding the variable gain circuit may operate stably.

FIG. 1 is a circuit diagram showing an example of a variable gain circuit according to the prior art (refer to Japanese Patent Laid-Open Application No. Heisei 4-319805). Referring to FIG. 1, reference numerals 51 and 52 denote PNP transistors, 53 to 62 NPN transistors, 63 and 64 diodes, 65 to 67 current sources, and 68 to 75 resistors. In the prior art, a pair of input signals are inputted to a differential pair formed from transistors 55 and 56, and the gain of the variable gain circuit is varied by the magnitude of the value of the current flowing through current source transistor 59 for the differential pair. Value $I_4$ of the current flowing through transistor 59 depends upon current $I_4'$ inputted to a current mirror circuit which is formed from transistor 59, resistors 71 and 74, and diode 64. Transistors 60 and 61 are connected in parallel to transistors 55 and 56, respectively, and these transistors 60 and 61 are connected to transistor 62. Current value $I_5$ flowing through transistor 62 depends upon current $I_5'$ inputted to another current mirror circuit which is formed from transistor 62, resistors 70 and 75, and diode 63. Currents $I_4'$ and $I_1'$ depend upon the currents flowing through transistors 52 and 51, respectively. Here, the gain is controlled by applying gain control voltage Vagc to a terminal connected to the base of transistor 51 via resistor 68 to vary currents $I_4'$ and $I_5'$. In this instance, since transistors 51 and 52 construct a differential pair, $I_4'+I_5'$ is constant and is equal to the sum of the currents of current sources 65 and 66. Consequently, even if current value $I_4$ of current source transistor 59 varies, current value $I_5$ of transistor 62 varies so that the variation may be compensated for or cancelled, and the DC current components flowing through 72 and 73 always exhibit constant values. As a result, the variable gain circuit thus constructed does not exhibit a variation of the DC bias at output terminal Vout thereof even if gain control voltage Vagc is varied to vary the gain of the variable gain circuit.

In the prior art, the differential pair connected to the current source and formed from transistors 51 and 52 is formed from PNP transistors. However, the prior art circuit cannot be used for a high speed IC whose working speed is higher than several GHz because only NPN transistors can be used for the high speed IC. Further, since amplification in the prior art circuit is performed only by the differential pair formed from transistors 55 and 56, in order to lower the gain by a great amount, the current values of the transistors must be reduced as much, which results in deterioration in frequency characteristic.

SUMMARY OF THE INVENTION

A variable gain circuit is characterized in that a pair of input signals having the opposite polarities to each other are connected to differential inputs of a first differential amplifier and a second differential amplifier, that the positive outputs of the first differential amplifier and the second differential amplifier are connected to a first load and a first output terminal while the negative outputs of the first differential amplifier and the second differential amplifier are connected to a second load and a second output terminal, that a first constant current source for supplying operating current to the first differential amplifier is connected to the first differential amplifier while a second constant current source for supplying operating current to the second differential amplifier is connected to the second differential amplifier, that a control signal is connected to an input of a third differential amplifier, that a third constant current source for supplying operating current to the third differential amplifier is connected to the third differential amplifier, that a first voltage to current conversion circuit for converting a variation in voltage of one of a pair of outputs of the third differential amplifier into a variation in current and inputting the resulted current to a reference current input terminal of the first constant current source is connected to the one output of the third differential amplifier while a second voltage to current conversion circuit for converting a variation in voltage of the other output of the third differential amplifier into a variation in current and inputting the resulted current to a reference current input terminal of the second constant current amplifier is connected to the other output of the third differential amplifier, and that differential output signals are obtained from the first and second output terminals.

An example of the construction of the present invention is shown in FIG. 2. In the present invention, two differential amplifier pairs including a first differential pair (1) and a second differential pair (2) are connected in parallel, and a first load (7) and a second load (8) are connected to the first and second differential pairs (1) and (2) to obtain output signals. Further, input signals are connected to the input terminals of the first and second differential pairs (1) and (2) such that the input signals may be inputted with the opposite polarities between the first and second differential pairs (1) and (2). Consequently, the gain of the variable gain circuit can be varied by varying the current values of current sources for the two differential pairs. The current sources serve also as current sources for a first current mirror circuit (4) and a second current mirror circuit (5). The current values of the current sources are equal to currents inputted to the current mirror circuits, and the input current to the first current mirror circuit (4) connected to the current source for the first differential pair (1) is supplied from a first voltage to current conversion circuit (11) which converts the variation in output voltage of one of two outputs of a current controlling third differential pair (3) into a variation in current. Meanwhile, the input current to the second current mirror circuit (5) connected to the second differential pair (2) is supplied from a second voltage to current conversion circuit (12) which converts the variation in output voltage of the other output of the third differential pair (3) into a variation in current. Consequently, even if a gain control voltage (Vcon) to be applied to the input terminals of the third differential pair (3) is varied to vary the input currents to the current mirror circuits, the sum of the currents to be inputted to the two current mirror circuits is always fixed such that, if one of the currents increases, then the other current decreases as much. Consequently, also the sum of the current value of the current source for the first current mirror circuit (4) connected to the first differential pair (1) and the current value of the current source for the current mirror circuit (5) connected to the second differential pair (2) is fixed, and also the DC voltage value at the output terminals is fixed.

The above and other objects, features, and advantages of the present invention will become apparent from the following description based on the accompanying drawings which illustrate an example of a preferred embodiment of the present invention.

DETAILED DESCRIPTION OF THE PREFERRED EMBODIMENT

Figure 1:
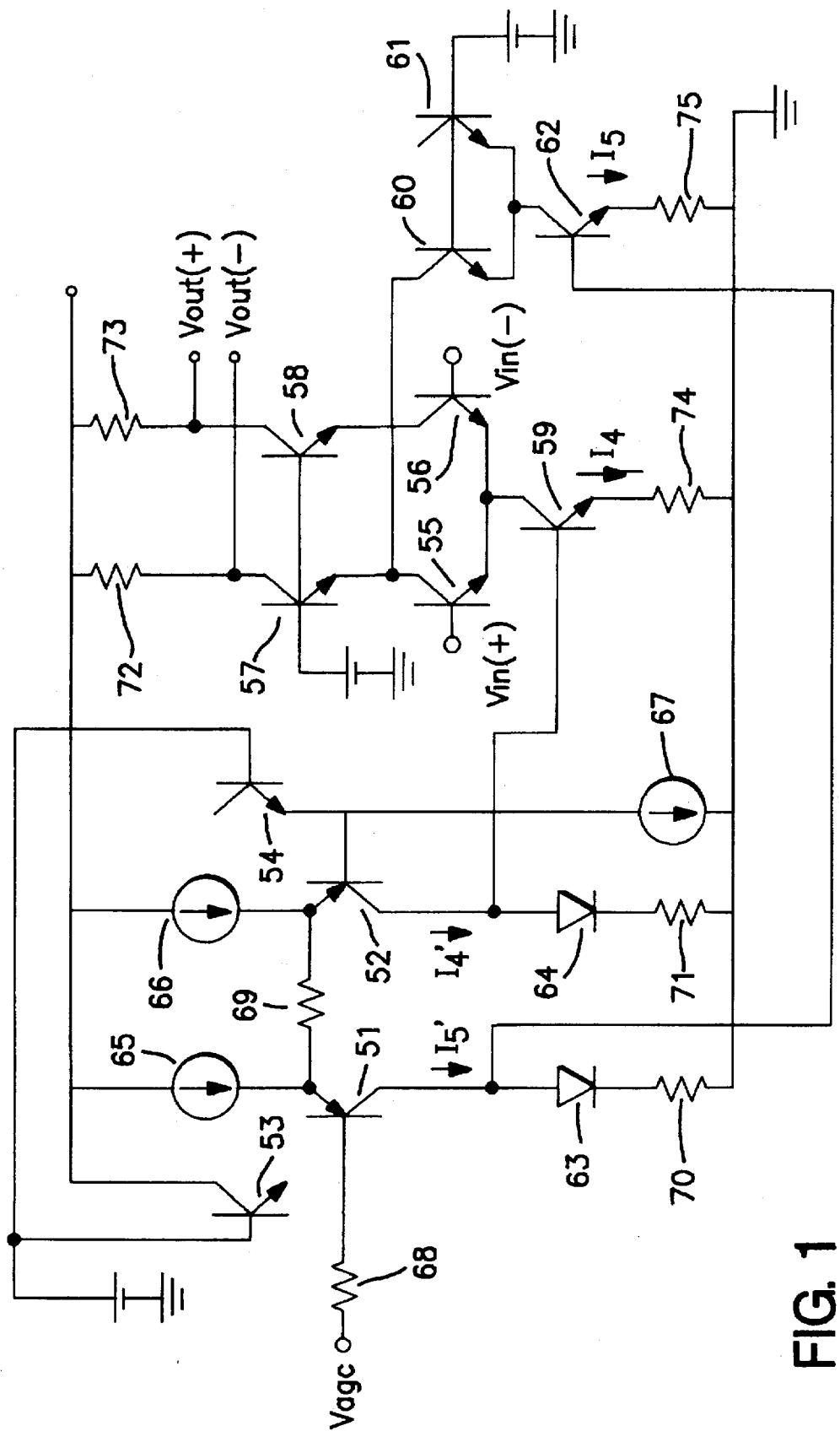
FIG. 1 is a circuit diagram showing a prior art variable gain amplifier.
Figure 2:
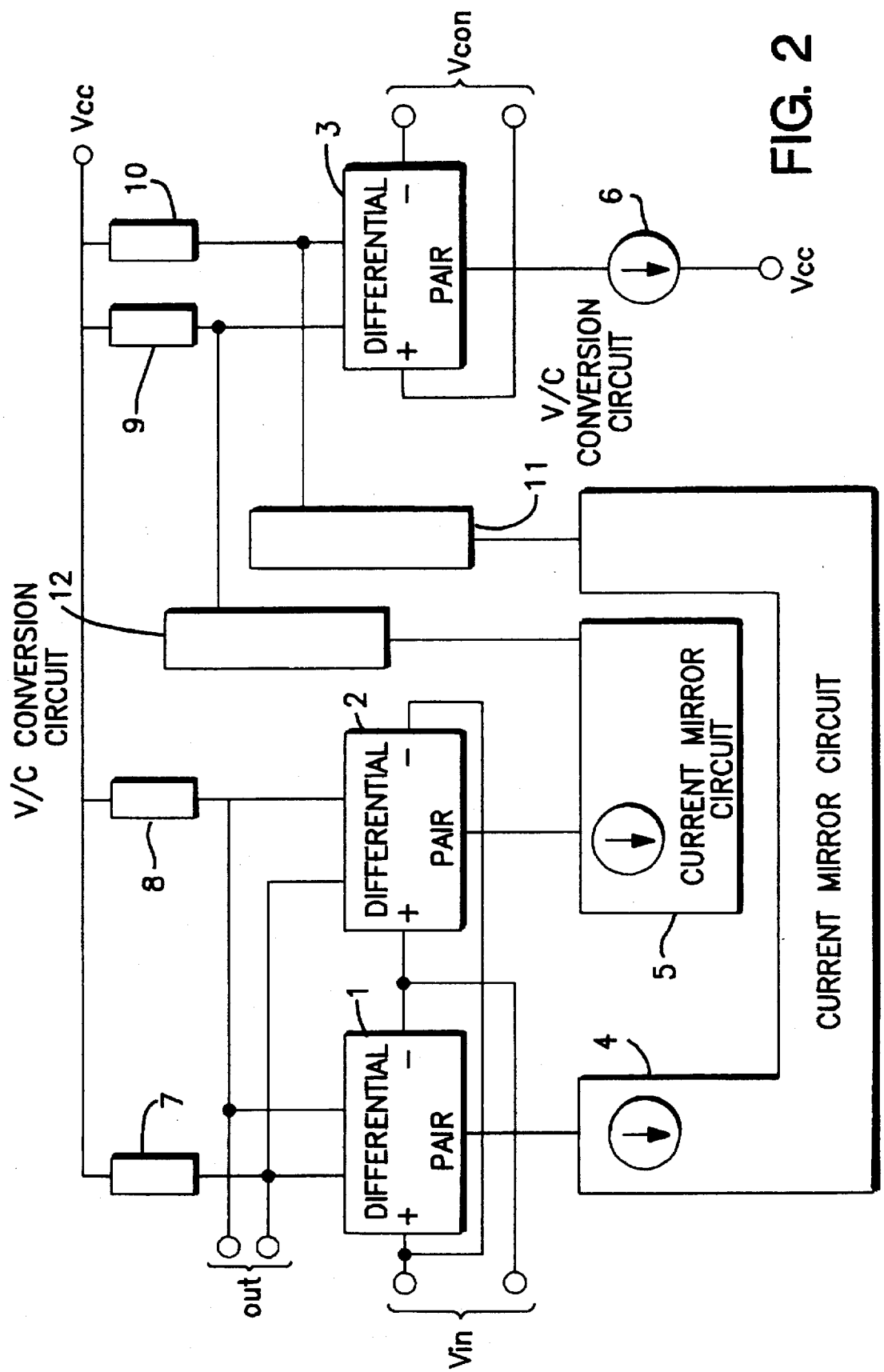
FIG. 2 is a circuit diagram illustrating the construction of the present invention.
Figure 3:
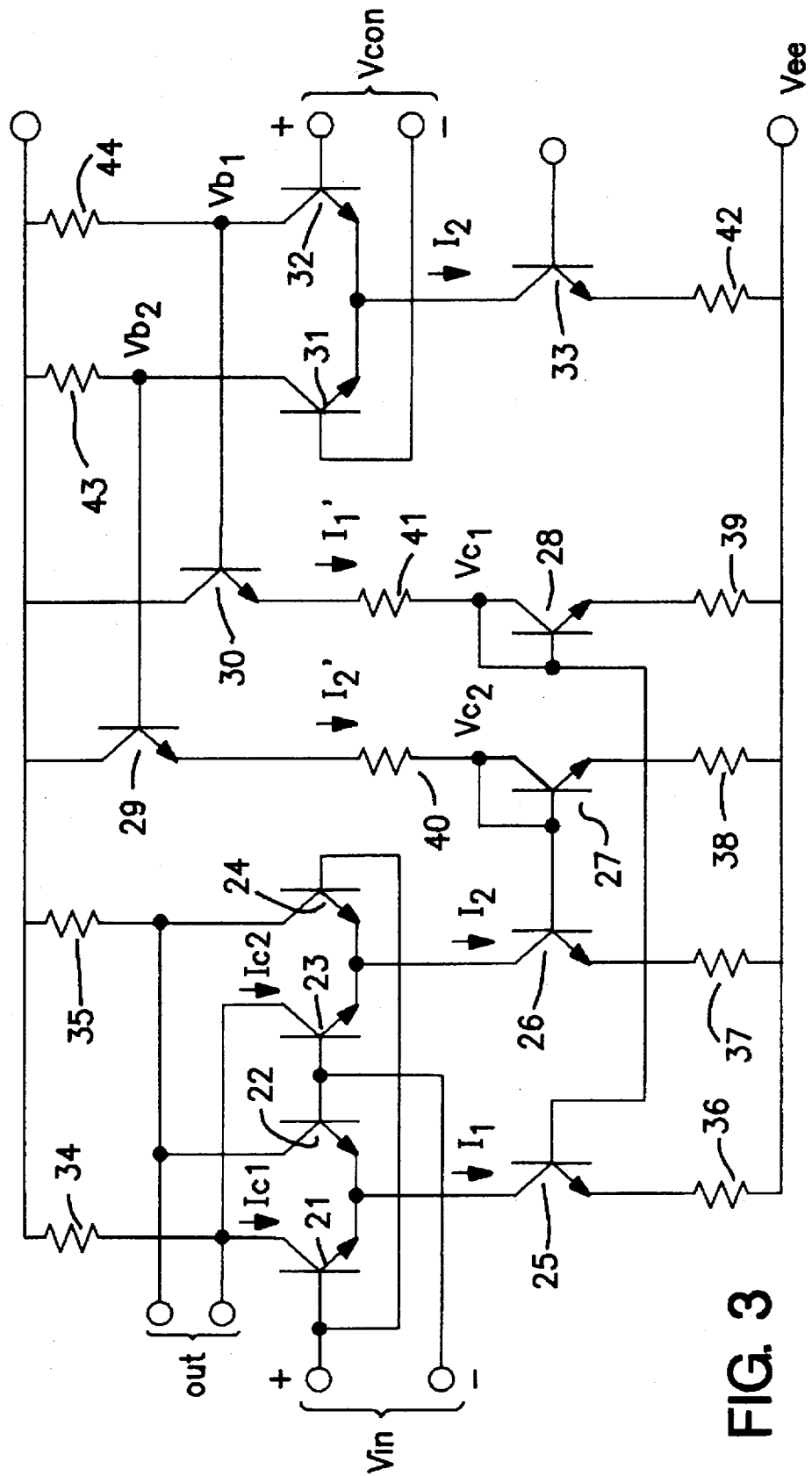
FIG. 3 is a circuit diagram showing an embodiment of the present invention.
Figure 4:
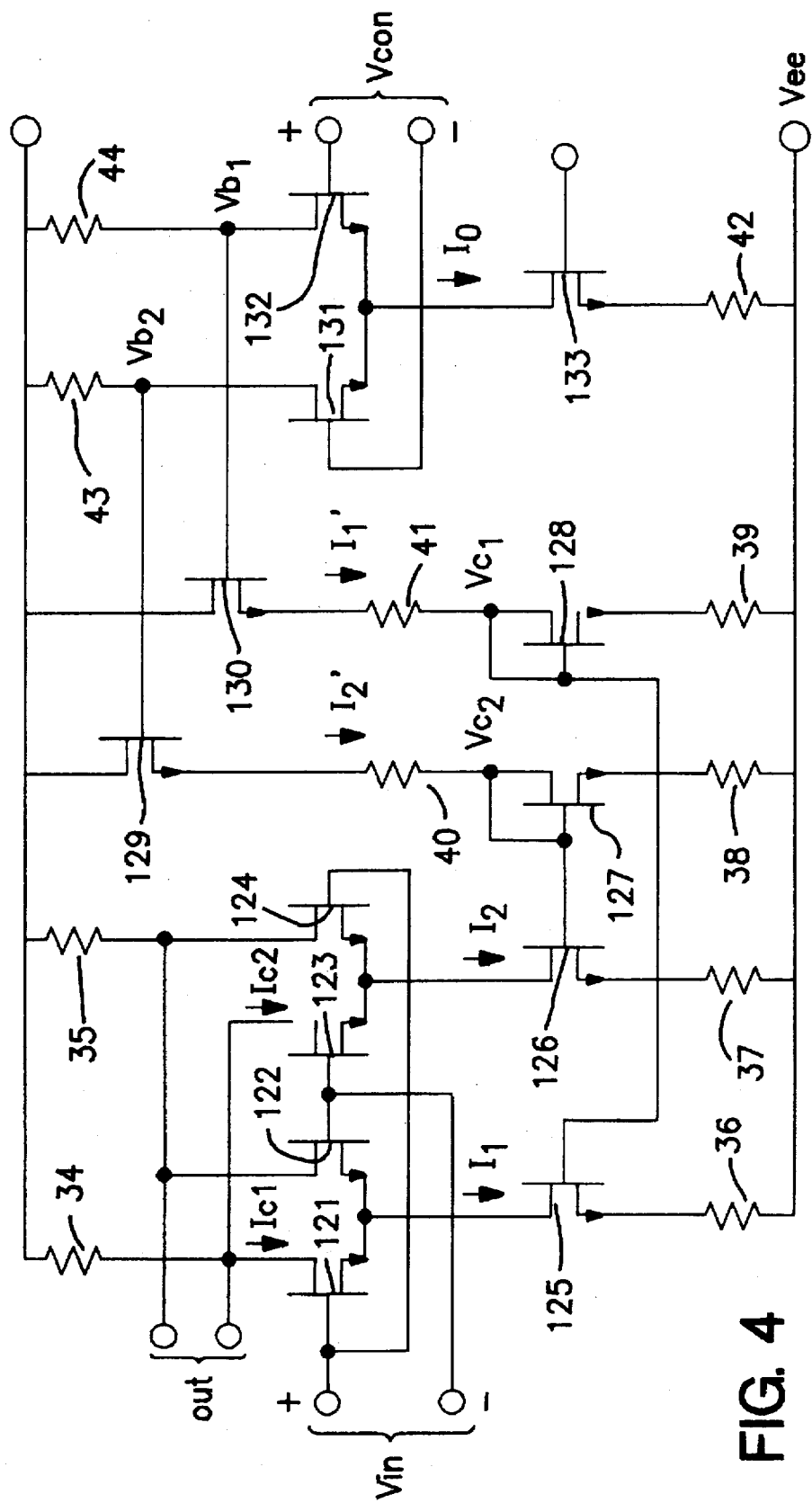

FIG. 3 is a circuit diagram showing an embodiment of a variable gain circuit to which the present invention is applied. A first differential pair is formed from transistors 21 and 22, and a second differential pair is formed from transistors 23 and 24. Differential input signals Vin are inputted to the first and second differential pairs. Here, the bases of transistor 21 of the first differential pair and transistor 24 of the second differential pair are connected to the + side differential input terminal, and the bases of transistor 22 of the first differential pair and transistor 23 of the second differential pair are connected to the—side differential input terminal. Here, where the current flowing through current source transistor 25 for the first differential pair is represented by $I_1$, the current flowing through current source transistor 26 for the second differential pair is represented by $I_2$, and the input differential voltage is represented by Vin, collector Ic1 of transistor 21 is represented by the following equation:

$$Ic1 = \frac{I_1}{2} + \frac{I_1}{4Vt} Vin$$

Meanwhile, collector current Ic2 of transistor 23 is represented by the following equation:

$$Ic2 = \frac{I_2}{2} + \frac{I_2}{4Vt} Vin$$

As a result, the current flowing through load resistance 34 is represented by the following equation:

$$Ic1 + Ic2 = \frac{I_1 + I_2}{2} + \frac{Vin}{4Vt}(I_1 - I_2) \quad (1)$$

In equation (1), the first term of the right side is a term relating to the DC current while the second term of the right side is a term relating the AC current, and it can be seen from the second term of the right side that the gain depends upon $(I_1-I_2)$. Further, $I_1$ is equal to current $I_1'$ inputted to a first current mirror circuit formed from transistors 25 and 28 and resistors 36 and 39. Meanwhile, $I_2$ is equal to current $I_2'$ inputted to a second current mirror circuit formed from transistors 26 and 27 and resistors 37 and 38. Here, where the base potential and the base-emitter voltage of transistor 30 are represented by $Vb_1$ and $Vbe_1$, respectively, the collector potential of transistor 28 is represented by $Vc_1$, the base potential and the base-emitter voltage of transistor 29 are represented by $Vb_2$ and $Bbe_2$, respectively, the collector potential of transistor 27 is represented by $Vc_2$, and the resistance value of resistors 40 and 41 is represented by Re, $I_1'$ and $I_2'$ are given by the following equations, respectively:

$$I_1' = \frac{Vb_1 - Vc_1 - Vbe_1}{Re} \quad (2)$$

$$I_2' = \frac{Vb_2 - Vc_2 - Vbe_2}{Re} \quad (3)$$

Where the current of current source transistor 33 for a third differential pair formed from transistor 31 and transistor 32 is represented by $I_3$ and the resistance values of resistors 43 and 44 are represented by RL, the potentials of $Vb_1$ and $Vb_2$ are given by the following equations, respectively:

$$Vb_1 = \left(\frac{I_3}{2} + \frac{I_3}{4Vt} Vcon\right) \times RL \quad (4)$$

$$Vb_2 = \left(\frac{I_3}{2} - \frac{I_3}{4Vt} Vcon\right) \times RL \quad (5)$$

From equations (2) to (5) and from the facts of $Vc_1=Vc_2$ and $Vbe_1=Vbe_2$, the following equation is obtained:

$$I_1' + I_2' = \frac{I_3 \times RL - 2Vc_1}{Re} \quad (6)$$

Even if gain control voltage Vcon is varied in order to vary the gain, since $I_1'+I_2'$ is constant from equation (6), also $I_1+I_2$ is constant. As a result, it can be seen from equation (1) that also the DC potential at the outputs is constant.

As described above, according to the present invention, even if the gain is varied, the DC potential at the outputs is constant, and also when the gain is to be reduced, the gain can be varied without deterioration of the frequency characteristics of the transistors of the differential pairs since sufficient currents flow through the differential pairs. Since the circuit of the present invention can be formed only from NPN transistors which have a good high speed characteristic, the variable gain circuit can be formed so as to operate at a high speed of several GHz, and since the number of stages of cascade connections of transistors is two, the variable gain amplifier can operate at a low voltage. Production of a prototype of a variable gain amplifier of 2.4 GHz using the circuit of the present invention proved realization of an amplifier which exhibits a variable gain of 20 dB upon operation at 3.3 V and exhibits little deterioration in frequency characteristic.

Further, the variable gain circuit of the present invention can be constructed not only from bipolar transistors but also from FETs. Production of a prototype using high speed FETs of chemical materials proved realization of a variable gain amplifier which exhibits a variable gain of 16 dB upon operation at 2.5 V.

As described above, according to the present invention, a wideband variable gain amplifier which operates at a low voltage without a variation in output DC potential can be formed, and a wideband IC of a high integration can be realized.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A variable gain circuit, wherein a pair of input signals having the opposite polarities to each other are connected to differential inputs of a first differential amplifier and a second differential amplifier, the positive outputs of said first differential amplifier and said second differential amplifier are connected to a first load and a first output terminal while the negative outputs of said first differential amplifier and said second differential amplifier are connected to a second load and a second output terminal, a first constant current source for supplying operating current to said first differential amplifier is connected to said first differential amplifier while a second constant current source for supplying operating current to said second differential amplifier is connected to said second differential amplifier, a control signal is connected to an input of a third differential amplifier, a third constant current source for supplying operating current to said third differential amplifier is connected to said third differential amplifier, a first voltage to current conversion circuit for converting a variation in voltage of one of a pair of outputs of said third differential amplifier into a variation in current and inputting the resulted current to a reference current input terminal of said first constant current source is connected to the one output of said third differential amplifier while a second voltage to current conversion circuit for converting a variation in voltage of the other output of said third differential amplifier into a variation in current and inputting the resulted current to a reference current input terminal of said second constant current source is connected to the other output of said third differential amplifier, and differential output signals are obtained from said first and second output terminals; and further each of said voltage to current conversion circuits is formed from a transistor and a resistor, and the bases of the transistors are connected to the outputs of said third differential amplifier while the emitters of the transistors are connected to said reference current input terminals of said first and second constant current sources via said resistors.

2. A variable gain circuit, wherein a pair of input signals having the opposite polarities to each other are connected to differential inputs of a first differential amplifier and a second differential amplifier, the positive output of said first differential amplifier and said second differential amplifier are connected to a first load and a first output terminal while the negative outputs of said first differential amplifier and said second differential amplifier are connected to a second load and a second output terminal, a first constant current source for supplying operating current to said first differential amplifier is connected to said first differential amplifier while a second constant current source for supplying operating current to said second differential amplifier is connected to said second differential amplifier, a control signal is connected to an input of a third differential amplifier, a third constant current source for supplying operating current to said third differential amplifier is connected to said third differential amplifier, a first voltage to current conversion circuit for converting a variation in voltage of one or a pair of outputs of said third differential amplifier into a variation in current and inputting the resulted current to a reference current input terminal of said first constant current source is connected to the one output of said third differential amplifier while a second voltage to current conversion circuit for converting a variation in voltage of the other output of said third differential amplifier into a variation in current and inputting the resulted current to a reference current input terminal of said second constant current source is connected to the other output of said third differential amplifier, and differential output signals are obtained from said first and second output terminals; and further each of said voltage to current conversion circuits is formed from a FET and a resistor, and that the gates of the FETs are connected to the outputs of said third differential amplifier while the sources of the FETs are connected to said reference current input terminals of said first and second constant current sources via said resistors.

* * * * *